United States Patent [19]

Wilson

[11] Patent Number: 5,627,857

[45] Date of Patent: May 6, 1997

[54] LINEARIZED DIGITAL AUTOMATIC GAIN CONTROL

[75] Inventor: Nathaniel B. Wilson, San Diego, Calif.

[73] Assignee: Qualcomm Incorporated, San Diego, Calif.

[21] Appl. No.: 528,969

[22] Filed: Sep. 15, 1995

[51] Int. Cl.$^6$ ............................... H04B 1/38; H04L 5/16
[52] U.S. Cl. .................... 375/219; 375/345; 455/234.1; 455/250.1; 455/115
[58] Field of Search ..................... 375/345, 205, 375/296, 219; 455/245.1, 250.1, 245.2, 232.1, 234.1, 234.2, 115, 127, 136, 138, 239.1, 240.1, 249.1

[56] References Cited

U.S. PATENT DOCUMENTS

| | | | |
|---|---|---|---|
| 4,870,698 | 9/1989 | Katsuyama et al. | 455/67 |
| 4,958,359 | 9/1990 | Kato | 375/1 |
| 5,056,109 | 10/1991 | Gilhousen et al. | 375/1 |
| 5,107,225 | 4/1992 | Wheatley, III et al. | 455/239.1 |
| 5,129,098 | 7/1992 | McGirr et al. | 455/127 |
| 5,134,722 | 7/1992 | Emslie et al. | 455/249.1 |
| 5,199,045 | 3/1993 | Kato | 375/1 |
| 5,257,283 | 10/1993 | Gilhousen et al. | 375/1 |
| 5,267,262 | 11/1993 | Wheatley, III | 375/1 |
| 5,278,992 | 1/1994 | Su et al. | 455/69 |
| 5,279,161 | 1/1994 | Glassey et al. | 73/708 |
| 5,452,473 | 9/1995 | Weiland et al. | 455/88 |

FOREIGN PATENT DOCUMENTS

| | | | |
|---|---|---|---|
| 9107037 | 11/1990 | WIPO | H04L 27/30 |
| 9302505 | 6/1992 | WIPO | H04B 1/04 |

OTHER PUBLICATIONS

Samir Soliman et al., "CDMA Reverse Link Open Loop Power Control", *IEEE Communications Society*, vol. 1 of 3, Jun. 12, 1992, pp. 69–73.

*Primary Examiner*—Stephen Chin
*Assistant Examiner*—Don Vo
*Attorney, Agent, or Firm*—Russell B. Miller; Roger W. Martin

[57] ABSTRACT

The present invention provides linear, digital automatic gain control (AGC) in a radio. A received signal is demodulated to provide I and Q digital baseband signals. A received signal strength indication is determined from these signals and the resulting digital signal is adjusted to provide a logarithmic response. This signal is then integrated to provide a digital receive AGC adjust signal. For the transmit AGC adjust, the digital receive AGC adjust signal is filtered and then summed with a scaled closed loop power control command. The closed loop power control commands are ignored if they would result in increasing the transmit gain beyond the amplifier's designed maximum output. The result of the sum operation converted from digital to analog for adjusting the amplifier. The outputs of the transmit and receive AGC amplifiers are linearized by transmit and receive linearizers, respectively, which pre-distort the digital AGC adjust signals prior to digital to analog conversion.

14 Claims, 8 Drawing Sheets

LINEARIZED DIGITAL AUTOMATIC GAIN CONTROL

BACKGROUND OF THE INVENTION

I. Field of the Invention

The present invention relates generally to communication systems and particularly to power control in a radiotelephone system.

II. Description of the Related Art

The Federal Communications Commission (FCC) governs the use of the radio frequency (RF) spectrum. The FCC allocates certain bandwidths within the RF spectrum for specific uses. A user of an allocated bandwidth of the RF spectrum must take measures to ensure that the radiated emissions inside and outside of that bandwidth are maintained within acceptable levels to avoid interfering with other users operating in the same or other bandwidths. These levels are governed by both the FCC and the particular user groups of the bandwidth.

The 800 MHz cellular radiotelephone system operates its forward link, the cell to radiotelephone transmission, in the bandwidth of 869.01 MHz to 893.97 MHz. The reverse link, the radiotelephone to cell transmission, is in the bandwidth of 824.01 MHz to 848.97 MHz. The forward and reverse link bandwidths are split up into channels, each channel occupying a 30 kHz bandwidth. A particular user of the cellular system may operate on one or several of these channels at the same time.

There are several different techniques of modulation that can be used in the cellular radiotelephone system. Two examples of modulation techniques are frequency division multiple access (FDMA) and code division multiple access (CDMA).

The FDMA modulation technique generates signals that occupy one channel at a time while the CDMA modulation technique generates signals that occupy several channels. Both of these techniques must control their return link radiated emissions to within acceptable limits inside and outside of the assigned channel or channels. For maximum system performance, users of the CDMA technique must carefully control the level of radiated power inside the channels in which they are operating.

A CDMA receiver that receives digitally modulated information signals generally includes a variable gain amplifier with a gain adjusted by a control signal. The process of adjusting the gain of a received signal using a control signal is called automatic gain control (AGC). Typically, in digital receivers, the AGC process involves measurement of an output signal power of the variable gain amplifier.

The measured value is compared with a reference value, representing the desired signal power, to generate an error signal. The error signal is then used to control the variable amplifier gain so as to adjust the signal strength to coincide with the desired signal power.

To effect digital demodulation with an optimal signal to noise ratio, AGC is used to hold the magnitude of the baseband waveforms close to the full dynamic range of the baseband analog to digital converters. This generally requires that the AGC be provided over the full dynamic range of the received signal power.

Figure 1:
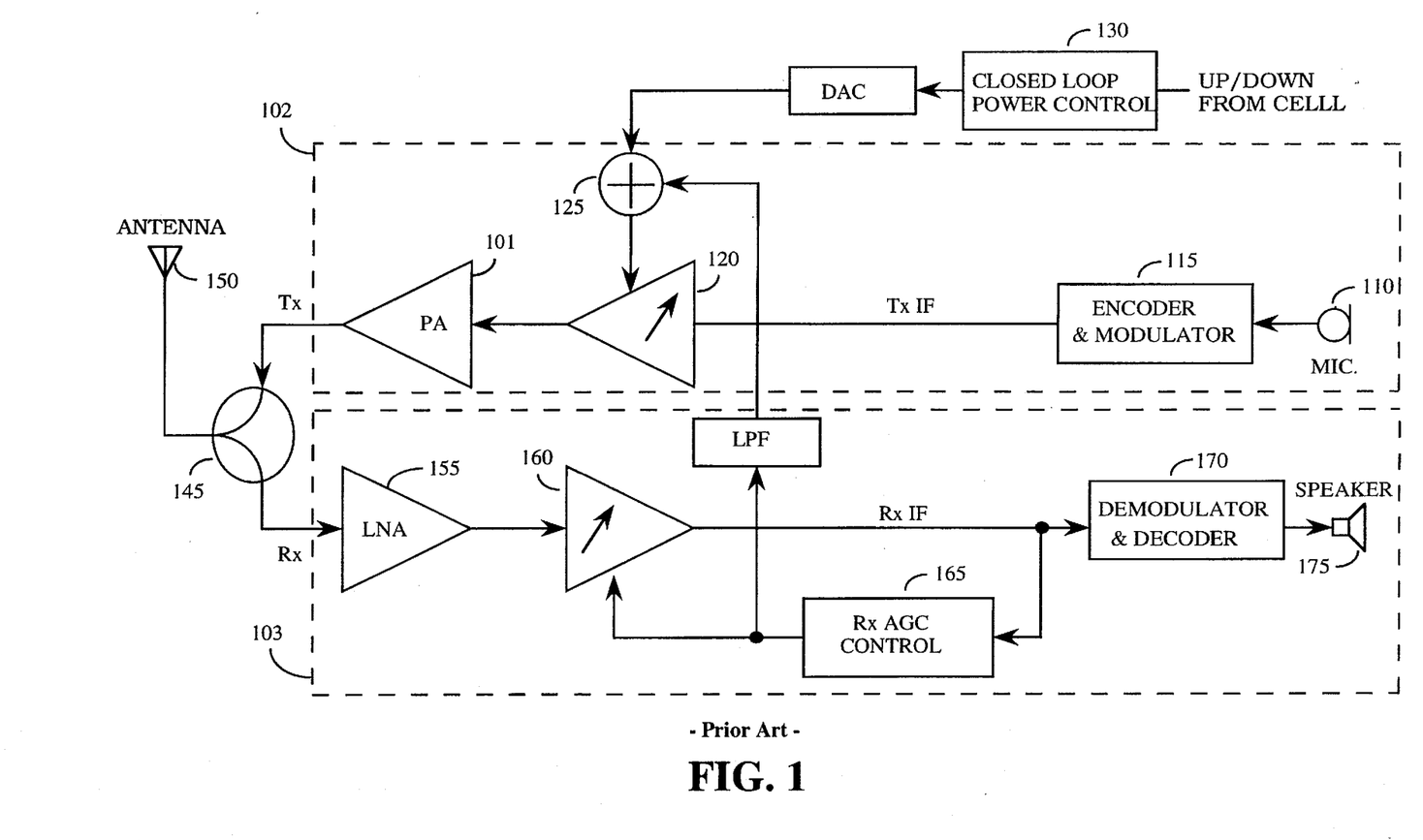
FIG. 1 shows a block diagram of a typical radiotelephone.

FIG. 1 shows a typical prior art cellular radiotelephone. This radiotelephone is comprised of a transmit section 102 and a receive section 103. In the transmit section 102, a microphone 110 picks up a voice signal and changes it into an analog signal that is encoded and modulated 115. The modulated signal, $T_x$, is at an intermediate frequency. $T_x$ is input to an automatic gain control (AGC) amplifier 120. For CDMA radiotelephones the transmit AGC 120 is controlled by a combination 125 of the power level of the received signal, also known as open loop power control, and transmit power commands from the cell 130, also known as closed loop power control. Both open and closed loop power control are discussed in further detail in U.S. Pat. No. 5,056,109 issued to Gilhousen et al.

The signal from the AGC amplifier is input to a power amplifier 101. The amplified signal from the power amplifier 101 is input to a duplexer 145 that couples the signal to an antenna 150 for transmission over the channel.

In the receive section 103, a signal received by the antenna 150 is coupled to the receive section 103 by the duplexer 145. The received signal is input to a low noise amplifier (LNA) 155. The amplified signal from the LNA 155 is then input to the receive AGC 160. This AGC 160 is controlled 165 by the power level of the received signal. The signal from the receive AGC 160 is demodulated and decoded 170 before being transmitted as an analog voice signal by the speaker 175.

In CDMA based radiotelephones, it is possible to drive the power amplifier 101 in the transmitter beyond a power level where acceptable out-of-channel radiated emissions can be maintained. This is primarily due to the increased output distortion levels of the power amplifier 101 at high output powers. Also, driving the power amplifier 101 beyond a certain level can cause interference internal to the radiotelephone.

In CDMA based radiotelephones, the proper transmitted output power is determined by "open loop" estimates made by the phone, and by "closed loop" correction commands from the base station. The phone makes its open loop estimate by measuring the power received from the base station and assuming a symmetric channel, which is to say, for each dB that the receive signal is below a certain reference level, the phone will transit above another reference level by that same number of dB. This is generally accomplished by employing Automatic Gain Control amplifiers for both the receive and transmit paths that are "dB linear", and coupling their control signal to a common control mechanism which functions to bring the receive signal to the desired setpoint.

In theory, such an arrangement will produce the desired transmit output power. However, maintaining the proper on-channel output power can be difficult due to several undesirable effects in the radiotelephone hardware. For example, the CDMA based radiotelephone must implement a transmit power control scheme that operates over a very wide dynamic range, 80 dB to 90 dB. Any deviation from "dB Linear" in the transmit or receive AGC amplifiers will cause errors in the open loop output power level. Also, any gain variation (such as temperature or frequency induced) in the radio that does not affect the transmit and receive sections equally will cause errors in the power control performance.

Nonlinear errors also occur when lower quality components are used to reduce production costs or when lower power components are used to reduce power consumption. There is a resulting need for linear automatic gain control in a radiotelephone.

SUMMARY OF THE INVENTION

The present invention encompasses a linearized digital control apparatus for automatic gain control (AGC) in a radio. The radio has a transmit AGC amplifier and a receive AGC amplifier. A received signal strength detector is coupled to the receive AGC amplifier. This detector generates a digital power level signal from a received signal.

An integrator is coupled to the received signal strength detector. The integrator integrates the digital power level signal to generate a digital AGC adjust signal, which is presumed to be linearly related to the desired receive gain setting (in dB). A receive AGC linearizer is coupled to the integrator. The receive AGC linearizer predistorts the linear digital AGC adjust signal to compensate for the non-linearities in the AGC amplifier's response to the adjust signal.

A receive digital to analog converter (DAC) is coupled to the receive AGC linearizer. The DAC converts the predistorted receive adjust signal into an analog receive adjust signal. The analog signal is coupled to the receive AGC amplifier to control its gain.

In a CDMA radiotelephone embodiment, a transmit AGC linearizer is coupled to the receive power integrator. As with the receiver AGC linearizer, the transmit AGC linearizer predistorts the linear transmit adjust signal from the integrator to compensate for the non-linearities in the transmit AGC amplifier's response to the gain adjust signal.

A transmit DAC is coupled to the transmit linearizer and converts the predistorted transmit adjust signal into an analog transmit adjust signal. The analog signal is coupled to the transmit AGC amplifier to control its gain.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENT

The linearized digital AGC control of the present invention provides accurate, linear automatic gain control in an RF environment. The present invention operates over a wide dynamic range so that it can be used in both digital and analog type radio systems.

Figure 10:
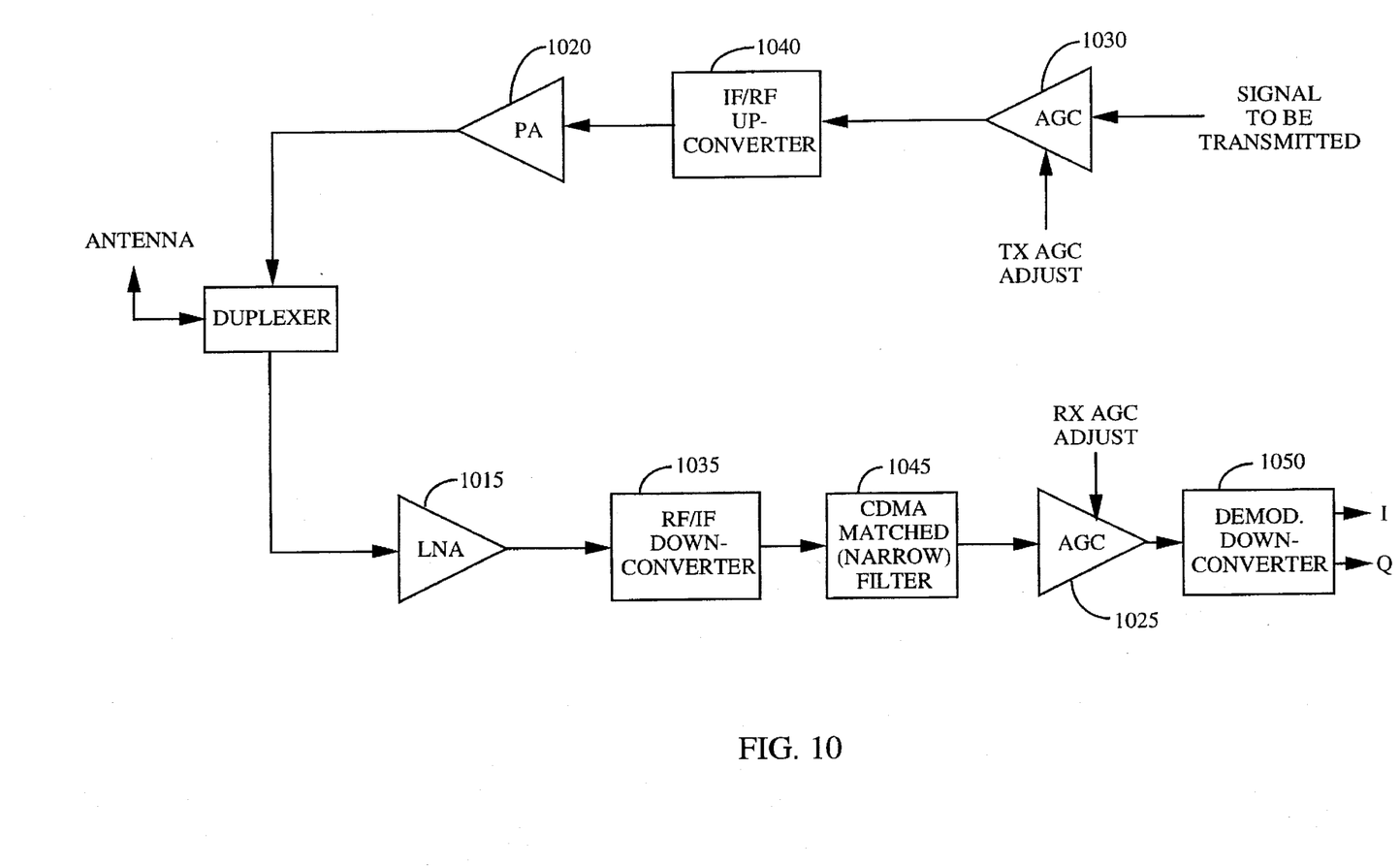
FIG. 10 shows a block diagram of the radiotelephone in accordance with the present invention.

As illustrated in FIG. 10, a received RF signal is input to the receiver's LNA 1015. The LNA 1015 has selectable gain settings in order to limit the dynamic range of an excessively strong signal before reaching the mixer. The gain is varied by the AGC control process of the present invention.

The amplified signal from the LNA 1015 is input to an RF to IF circuit 1035 to be downconverted to an intermediate frequency. In the preferred embodiment, this intermediate frequency is 85 MHz.

The IF signal is input to a bandpass filter 1045. As is well known in the art, the bandpass filter 1045 removes portions of the input IF signal that are not in the filter's pass band. Typical signals to be filtered out are jammer signals from radio transmission sources other than the one to which the radio of the present invention is communicating, as well as signals intended for other radiotelephone users.

The signal from the filter 1045 is input to the receive AGC amplifier 1025. The receive AGC amplifier 1025 is located after the down converter 1035 in order to adjust the gain after the jammers have been filtered out by the bandpass filter 1045. The receive AGC amplifier 1025, in conjunction with the transmit AGC amplifier 1030, perform the normal CDMA AGC function of open loop power control, closed loop power control, and compensation. Both the receive and transmit AGCs 1025 and 1030 are adjusted by the AGC control process of the present invention.

The receive and transmit AGCs 1025 and 1030 are required due to the wide dynamic range requirements for CDMA's receive and transmit links. In the preferred embodiment, the AGCs have greater than 80 dB of gain range.

The gain controlled IF signal from the receive AGC amplifier 1025 is input to a second downconverter 1050. This downconverter 1050 transforms input signals to baseband (0 Hz band center) as a set of In-phase and Quadrature signals (I & Q), and outputs them in digital form. It is understood that the digital to analog conversion performed by downconverter 1050 can be performed either before or after the transformation to baseband. The baseband signals, in the CDMA mode of operation, are I and Q samples of encoded digital data that are output for further demodulation and correlation. In a dual mode receiver that operates in both the FM and CDMA systems, the downconverter's 1050 I and Q outputs are further FM demodulated in order to provide an audio signal output.

Figure 2:
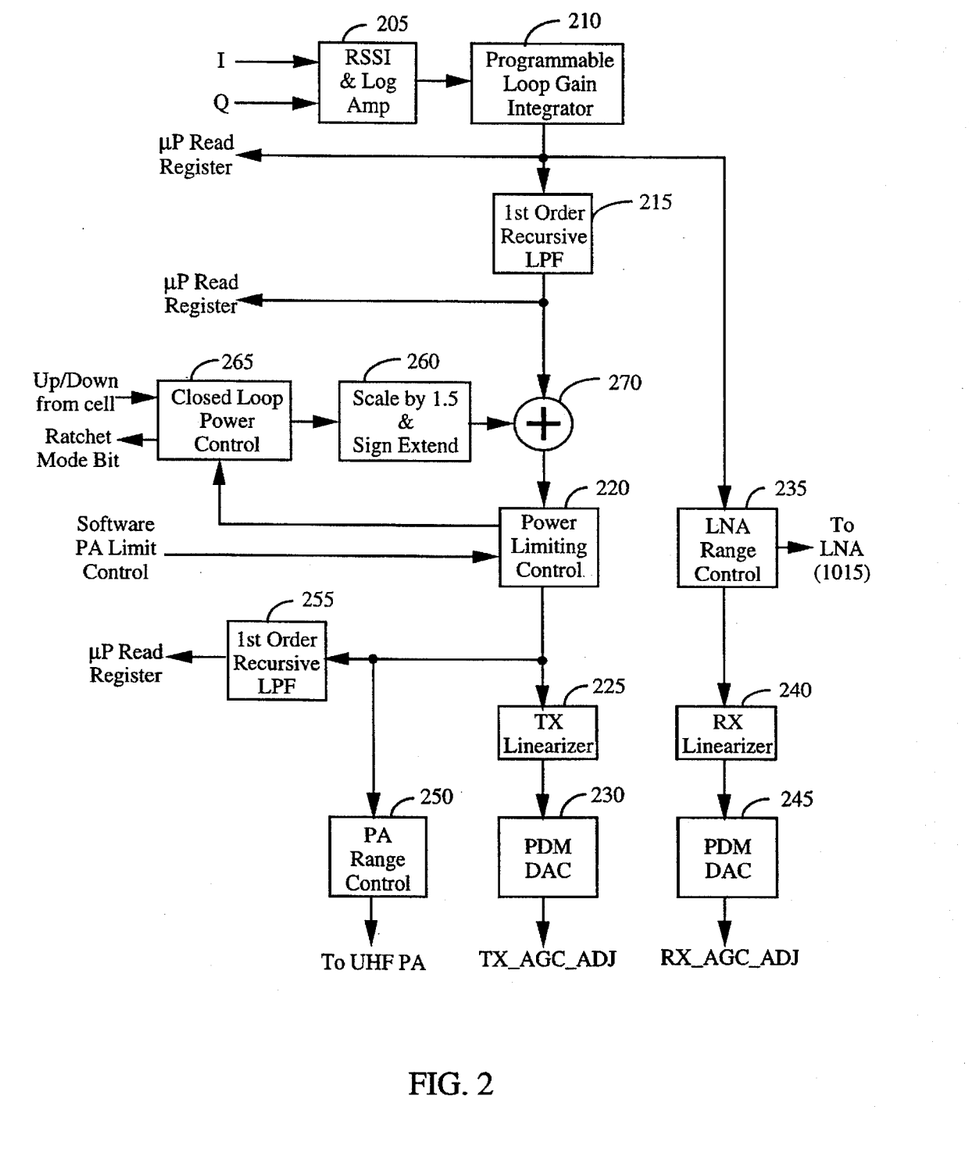
FIG. 2 shows a block diagram of the digital automatic gain control apparatus of the present invention.

The I and Q baseband signals are input to the received signal strength indicator (RSSI) and logarithmic amplifier circuit 205 of FIG. 2. This circuit measures the received signal power level. Additionally, since the AGC has a nominally exponential gain function (i.e. dB linear; if a control voltage change of X volts produces a gain change of Y dB, then a change of 2X will produce a gain change of 2Y dB), the input to the integrator 210 of the present invention must be logarithmic in order for the AGC loop's time constant to be consistent over the gain range. The function of the RSSI and log amplifier circuit 205, therefore, is to generate the logarithmic RSSI value and subtract off the log of the desired signal level. As a result, the output of the log amp is positive for inputs larger than desired, and negative for inputs smaller than desired. This error signal is then passed to the integrator 210.

Figure 3:
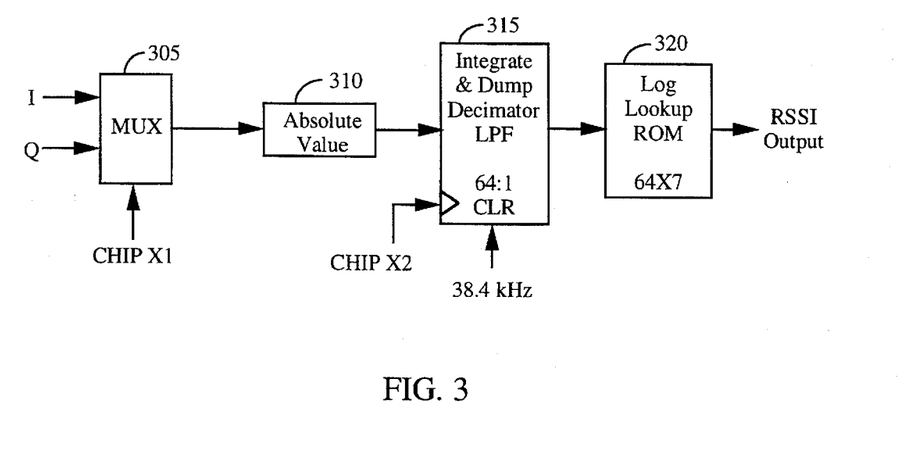
FIG. 3 shows a block diagram of the received signal strength indicator apparatus of the present invention.

The RSSI and logarithmic amplifier 205 is illustrated in greater detail in FIG. 3. This circuit is comprised of a multiplexer 305 that has the I and Q baseband signals as inputs. A clock signal causes the output of the multiplexer 305 to alternate between the I and Q inputs such that the RSSI value produced is the average of the I and Q components.

Since CDMA signals are Gaussian, the magnitude of the I and Q baseband signals must be averaged for many samples in order to measure the power in the signal (RSSI). The absolute value circuit 310 and the integrate and dump decimator low pass filter 315 together determine the average magnitude of I and Q over a predetermined time interval. In the preferred embodiment (for U.S. CMDA radiotelephones with a chip rate of 1.2288 MHz), this interval is a 38.4 kHz clock period in which 64 samples are averaged. The 38.4 kHz clock clears the integrate and dump decimator low pass filter 315 to zero after each group of 64 samples have been averaged. The integrate and dump decimator low pass filter 315 is clocked by a clock having twice the frequency of the clock input to the multiplexer 305.

The output of the integrate and dump decimator low pass filter 315 is used to address a logarithmic look-up table read only memory (ROM) 320. The ROM look-up table 320 contains values corresponding to the difference between the RSSI and a reference RSSI. The reference RSSI is the system's desired power level of the received signal. The values stored in the ROM look-up table 320 are additionally adjusted to provide a logarithmic response.

The RSSI signal output from the RSSI and log amplifier circuit 205 is at a 38.4 ksamples/sec. This signal, in the preferred embodiment, has a ±15 dB range in increments of 0.234 dB per least significant bit.

It should be noted that RSSI and Log Amp circuit of the present invention has an input dynamic range that exceeds that of the A/D converters that produce its input. The present circuit takes advantage of the Gaussian nature of the CDMA forward link. The Log ROM 320 not only provides a logarithmic function for inputs near the center of it's operating range, but it also compensates for clipping of the Gaussian input that occurs at either end of the range.

The RSSI signal is input to a programmable loop gain integrator 210. The integrator's 210 output will settle to a value that causes the receive AGC amplifier to output a signal level that equals the reference RSSI.

Figure 4:
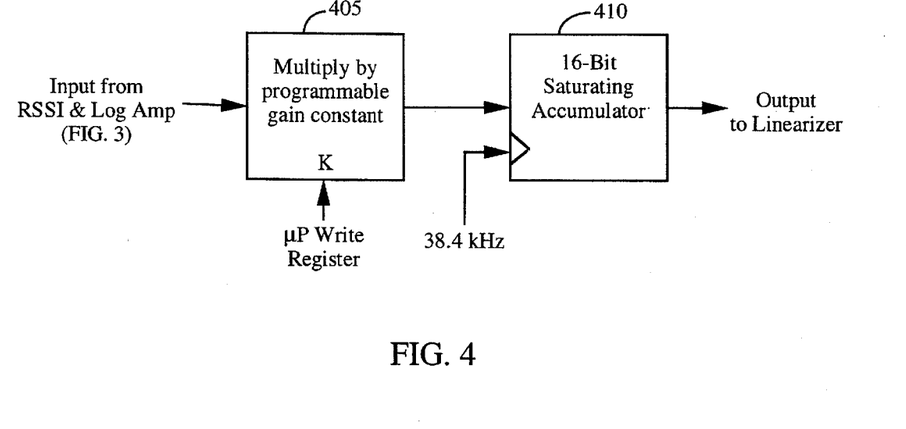
FIG. 4 shows a block diagram of the programmable loop gain integrator of the present invention.

The programmable loop gain integrator 210 of the present invention is illustrated in greater detail in FIG. 4. The integrator 210 is comprised of a multiplier 405 that multiplies the RSSI input by a gain constant. By varying this gain constant, the time constant of the complete AGC loop can be varied to meet the requirements of different situations. In the preferred embodiment, the gain constant is programmed into the integrator when a radiotelephone or other radio incorporating the present invention is manufactured.

The gain constant is determined by experimentation and depends on the delay through the RF circuitry. The time constant is set as fast as possible for the loop bandpass filter. Too slow of a time constant would mean too slow of a response while a time constant that is too fast causes undesirable oscillation.

The result from the multiplier 405 is input to a 16-bit saturating accumulator 410. The saturating accumulator 410 adds each new input sample to its previous output value. However, it "saturates" rather than "wrapping around" when its adder produces a carry or borrow.

To control the transmit AGC amplifier, the data signal from the integrator 210 is input to a first order recursive low pass filter 215. This filter 215, in the preferred embodiment, has a time constant of 26.7 ms.

The microprocessor in the radio incorporating the present invention reads the signal both before and after the low pass filter 215. The signal before the low pass filter 215 informs the microprocessor as to what the AGC adjust signal is that is controlling the receive AGC. The signal after the low pass filter 215 informs the microprocessor as to what gain adjust signal is being applied to the transmit AGC.

The low pass filtered signal is input to a summer 270 that sums this signal with a closed loop power control signal from the base station with which the radio is communicating. The closed loop power control signal instructs the radio to increase or decrease its power output depending on the signal received at the base station. The closed loop power control command from the base station is input to the closed loop power control circuit 265 for processing.

Prior to summing, the power control command from the base station is adjusted by a constant and a sign extend operation 260. This operation adjusts the closed loop power control command from the closed loop power control circuit 265 so that the proper step size is produced. For U.S. CDMA radiotelephones, each power control bit from the base station is ±1 dB. In the preferred embodiment, this constant is the equivalent of multiplying by 12 such that the integrator's 210 output has a weight of 0.083 dB/bit. In other embodiments, this gain constant could be programmable for added flexibility.

The scaled power control command and the signal from the low pass filter are summed and the result is input to a power limiting control 220. This power limiting is used to guarantee that the transmit power amplifier is not driven beyond its limits by keeping track of how high the transmit power amplifier is instructed to increase its gain.

The transmit power amplifier's maximum allowable output level is measured at the time of manufacture of the present invention. This value is known to the power limiting control. The gain setting that produces the maximum output level can be stored in the power limiting control circuit or written there by the microprocessor over the software PA limit control line.

In certain situations, such as when the radio is behind an obstruction, the base station may send multiple commands to the radio instructing it to increase transmit power. When the base station has transmitted power "up" commands to the radio to the point that the power amplifier output reaches the maximum value, the power limiting control instructs the closed loop power control to ignore any further power "up" commands. This prevents the power amplifier from being driven beyond its maximum allowable level, thus causing distortion in the transmitted signal. The closed loop power control still processes "down" power control commands normally.

The signal from the power limiting control 220 is input to a transmit linearizer 225. The transmit linearizer 225 compensates for non-linearities in the transmit AGC amplifier's response to the adjust signal. These non-linearities would contribute to errors in the transmitter's output power level. Given a 10-bit input word representing the desired output power level, the linearizer 225 generates a 9-bit output control word for the transmit AGC that is the best approximation of that which would produce the desired output power level.

Figure 6:
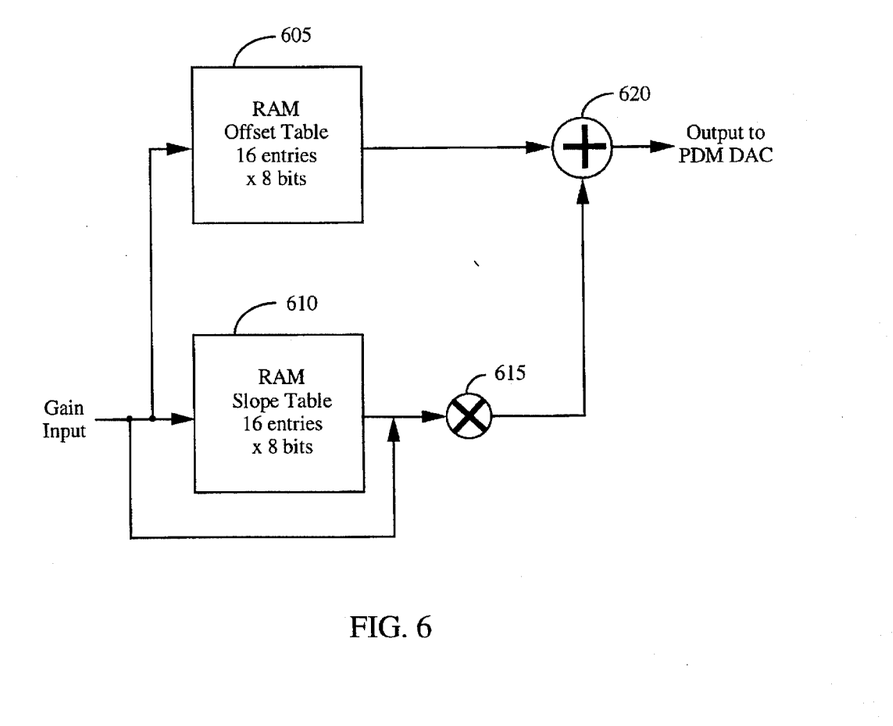
FIG. 6 shows a block diagram of the automatic gain control linearizer apparatus of the present invention.

The transmit linearizer 225 is illustrated in greater detail in FIG. 6. It functions as a lookup table. But since a direct implementation requires 1024 entries, the preferred embodiment uses two small lookup tables and linear interpolation. This simplifies the circuitry and reduces the amount of calibration data the radiotelephone must store. The linearizer 225 is comprised of two random access memory (RAM) look-up tables. One table stores a slope 610 and the other stores an offset 605. The four most significant bits of the input transmit AGC adjust signal are used to address the RAM tables 605 and 610. Both RAM tables 605 and 610 are organized in a 16×8 format.

Figure 7:
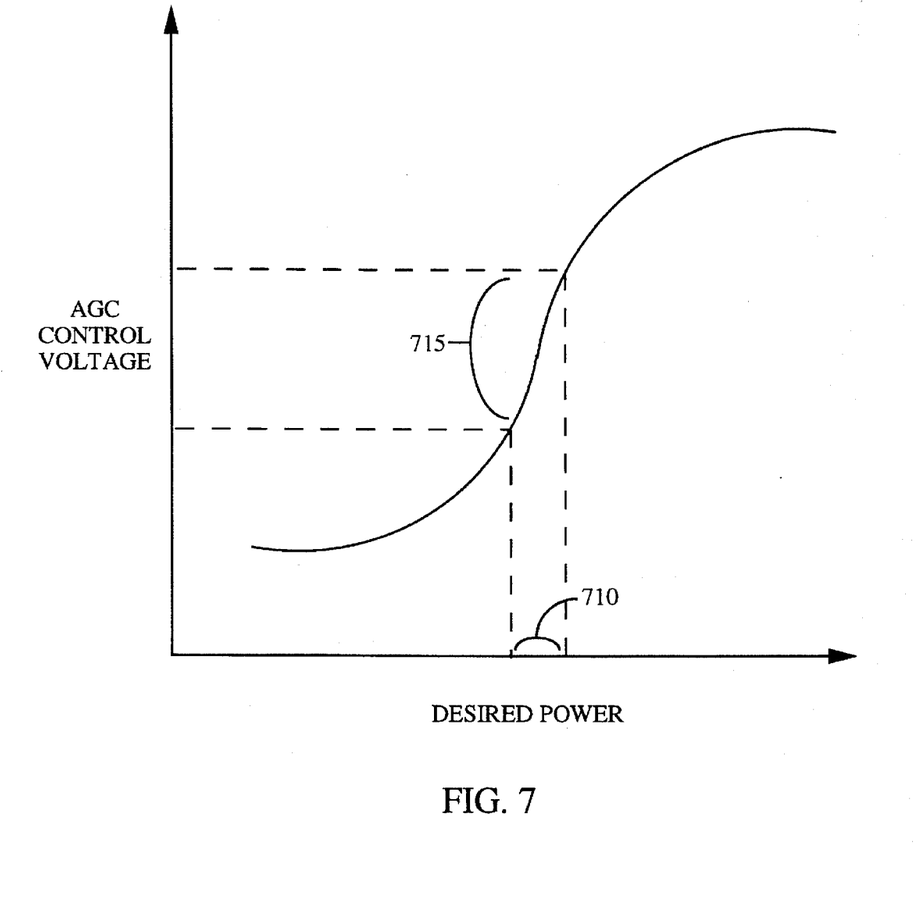
FIG. 7 shows a graph of an example waveform of desired power level versus AGC control voltage.

FIG. 7 shows a graph to illustrate the use of the RAM look-up tables. The x-axis represents the desired power while the y-axis represents the AGC control voltage. The segment 710 on the desired power axis is the segment identified by the 4 most significant bits (MSBs) of the input word. The corresponding output segment 715, has the slope and offset selected in the two RAMS by the 4 MSBs of the input word.

The slope data from the slope look-up table is multiplied by the 6 LSBs to generate a 9-bit word. This result is added to the 8 bits of offset data from the offset look-up table to generate the 9-bit output.

The data signal from the transmit linearizer is input to a pulse density modulation (PDM) DAC 230. The DAC 230 transforms the digital signal to an analog signal for use by the control input of the transmit AGC amplifier of the present invention, illustrated in FIG. 2. In the preferred embodiment, the DAC 230 is clocked by a 9.8304 MHz clock.

The data signal from the power limiting control 220 is also input to a power amplifier range control 250. The power amplifier range control 250 is a set of six comparators tied to a priority encoder with hysteresis. The transmit AGC adjust level is compared to different power levels to set the transmit power amplifier to four distinct ranges of output power. The power amplifier range control is encoded on a 2-bit output signal, which can be used by the power amplifier to select an appropriate bias current for example. Alternatively, the range control output could be used to select between multiple power amplifiers, each optimized for a limited operation range.

Figure 8:
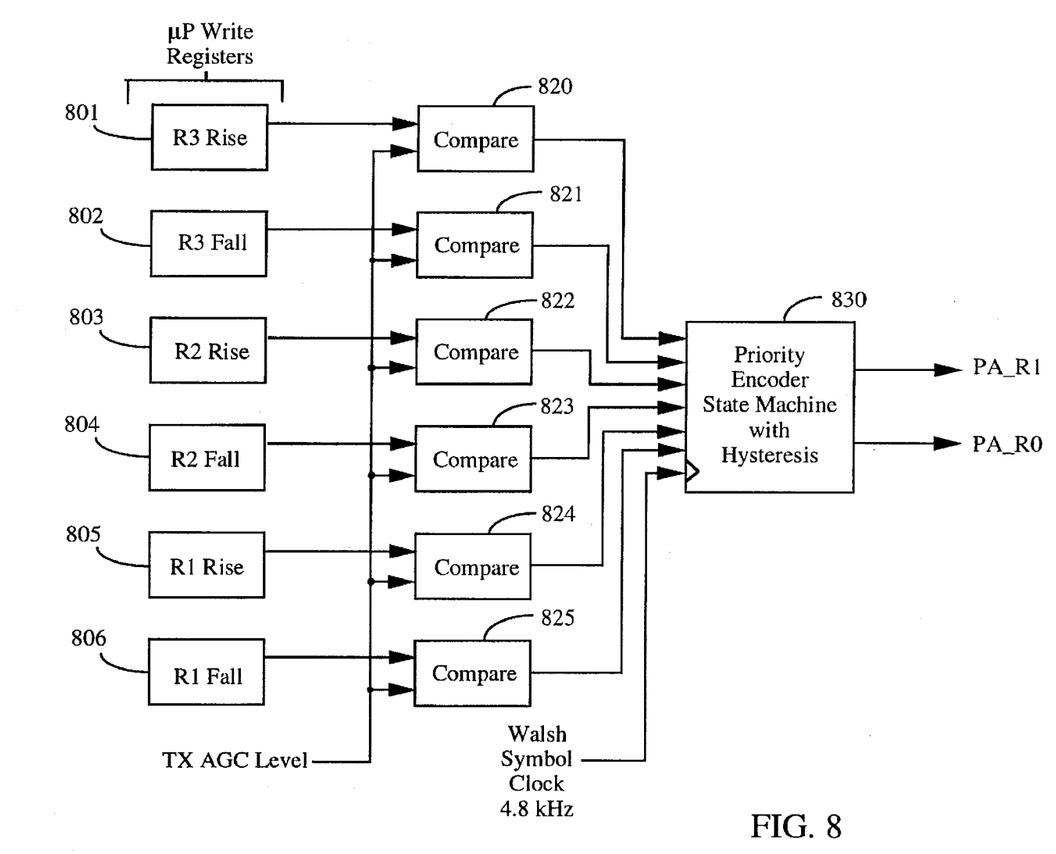
FIG. 8 shows a block diagram of the power amplifier range control of the present invention.

The power amplifier range control, illustrated in greater detail in FIG. 8, is comprised of six different registers 801–806 into which the microprocessor writes desired rise and fall thresholds for the transmit AGC adjust signal. For example, if it is desired that the transmit power amplifier range output signal switch around 18 dBm, the rise threshold may be set to 19 dBm and the fall threshold to 17 dBm, yielding 2 dB of hysteresis.

The input transmit AGC adjust signal is compared to these thresholds and, in the preferred embodiment, the comparators 820–825 output a logic "1" when the adjust signal is greater than the compared threshold. The priority encoder 830 then encodes these comparison results into a 2-bit power amplifier control word.

In a simple priority encoder, no hysteresis is used so only three comparators are needed to define the four ranges. The output is logical 11 if (Input≧threshold 3); logical 10 if the ((Input≧threshold 2) AND (Input<threshold 3); logical 01 if ((Input≧threshold 1) AND (Input<threshold 2), and logical 00 if (Input<threshold 1).

The priority encoder of the present invention uses hysteresis, which is to say that each of the logical output states will correspond to different input thresholds depending on the previous state. In particular, the threshold between two states is higher for a transition from the lower to the higher state than it will be for a transition from the higher to the lower state. This hysteresis helps reduce frequency of state transitions when the input is varying near a state threshold.

Figure 9:
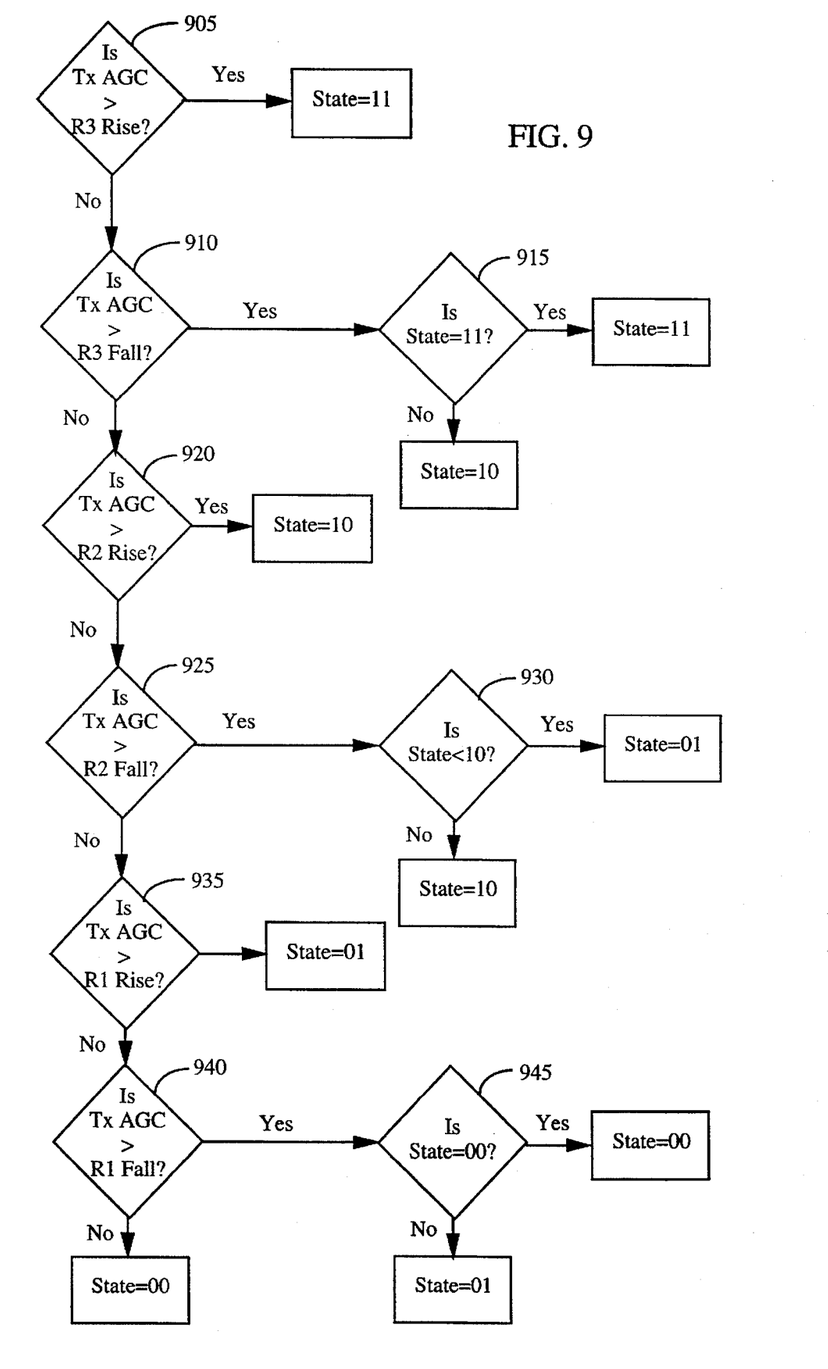
FIG. 9 shows a flowchart of the priority encoder process of the power amplifier range control of FIG. 8.

FIG. 9 shows a flow chart of the process of the priority encoder of the present invention. The process compares the transmit AGC adjust signal to the rise register 3 905. If the comparator outputs a logical 1, the output of the priority encoder is set to a logical 11 indicating that the transmit AGC adjust signal is greater than the maximum threshold. If not, the fall register 3 comparator is checked 910. If this comparator outputs a logical 1, and the output of the priority encoder is already in a logical 11 state 915, the state remains 11. If the priority encoder is not in a logical 11 state, the output is set to a logical 10 state. This indicates that the transmit AGC adjust signal is set at the power bounded by register pairs 2 and 3.

If the fall register 3 comparator is not in a logical 1 state, this indicates that the transmit AGC adjust signal is not at the higher power level set in register 3. In this case, the rise register 2 comparator is checked 920. If this comparator is in a logical 1 state, the output of the priority encoder is set to a logical 10 state. If this comparator is not in a logical 1 state, the fall register 2 comparator is checked 925. If this comparator is in a logical 1 state and the state of the priority encoder is less than a logical 10, the output of the priority encoder is set to a logical 01 state, indicating that the transmit AGC adjust signal is within the range set by register pairs 1 and 2. If not, the output is set to a logical 10 state.

If the fall register 2 comparator is not in a logical 1 state, the transmit AGC adjust signal is less than the power level set in register 2. In this case, the rise register 1 comparator is checked 935. If this comparator is in a logical 1 state, the output of the priority encoder is set to a logical 01 state. This indicates that the transmit AGC adjust signal is within the range set by register pairs 1 and 2.

If this comparator is not in a logical 1 state, the fall register 1 comparator is checked 940. If this comparator is in a logical 1 state and the state of the priority encoder is a logical 00 945, the output of the priority encoder remains in the logical 00 state. If the state of the priority encoder is not 00, the output is set to a logical 01 state. If the fall register 1 comparator is not in a logical 1 state, the output of the priority encoder is set to a logical 00 state indicating that the transmit AGC adjust signal range is between the minimum possible power and the power set by the first register pair.

When the power amplifier changes from one power range to another, the delay through the RF circuitry can change (for example, if separate amplifiers are used for each range). This shift in delay causes a shift in phase that can only be tolerated by the other radio circuitry during certain times. For this reason, the priority encoder 830 of FIG. 8 is clocked by the Walsh symbol clock running at 4.8 kHz. This allows the power amplifier control word to change only during the times when the phase change does not affect the bit error rate of the radio (i.e. at Walsh symbol boundaries).

The data signal from the power limiting control 220 is additionally input to a first order recursive low pass filter 255. The low pass filter 255 which has a time constant of 204 μs in the preferred embodiment (the delay is selected to closely match that of the PDM DAC and the external DAC filter), filters the transmit AGC adjust signal and allows the microprocessor to read what is happening at the gain adjust input of the transmit AGC.

The microprocessor can also optionally read the power level of the power amplifier using appropriate external circuitry. This power level is compared to the desired power level according to output 255 and, therefore, determine the power amplifier's error relative to the desired transmit power level. The microprocessor can therefore recalibrate the transmitter for minimal error. This self-calibration is particularly important for setting the power limit control 220.

Referring again to the receive section of FIG. 2. The data signal from the loop gain integrator 210 is also input to an LNA range control circuit 235. This circuit 235 controls the gain of the LNA to improve the dynamic range of the receiver. Although the AGC amplifier provides most of the radio's gain adjustment range, in some cases there is an advantage to having the LNA's gain adjustable also.

The LNA is limited to two different gain settings (although clearly if continuously adjustable LNA gain is desired, the LNA could share a control signal with the AGC amplifier). The LNA range control can select one of these gain levels by setting the single control bit to either a logic "1" or a logic "0".

Figure 5:
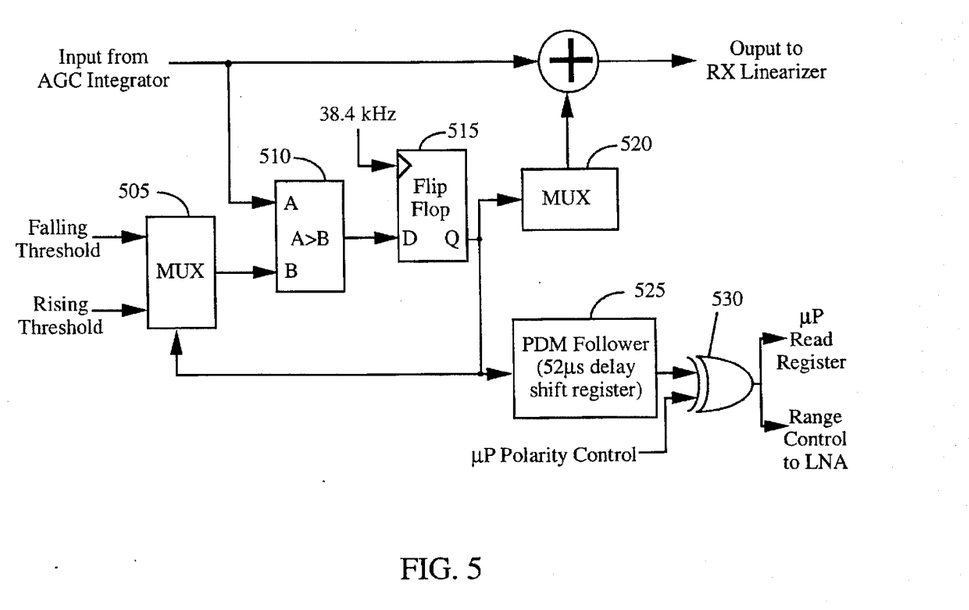
FIG. 5 shows a block diagram of the low noise amplifier range control apparatus of the present invention.

The LNA range control circuit 235, illustrated in greater detail in FIG. 5, serves to set the LNA to high gain when the required receiver gain exceeds a programmed value, and set the LNA to low gain when the required receiver gain is below that value (hysteresis is provided too). Additionally, whenever it switches the LNA gain, it simultaneously adjusts the control signal to the AGC amplifier to compensate for the change in LNA gain.

It is comprised of a multiplexer 505 that has two microprocessor write registers as inputs. One of the registers is a receive AGC gain adjust signal falling threshold and the other the rising threshold. The rising threshold is normally set a few dB higher than the falling threshold to provide hysteresis; this reduces the number of transitions which occur when the input is near the threshold.

The output of the multiplexer 505 is input to one input of a comparator 510. The other input of the comparator 510 is connected to the receive AGC gain adjust signal. If the AGC gain adjust signal is greater than the input threshold, the comparator 510 outputs a logic "1" to a D flip-flop 515.

The D flip-flop 510 latches in the result of the comparison. Since the flip-flop 515, in the preferred embodiment, is clocked by a 38.4 kHz clock, the output of the D flip-flop 515 is updated at that rate.

The output of the D flip-flop 515 is coupled to the control input of the input multiplexer 505 in order to select between the different threshold inputs and therefore causes the comparator to use one threshold for rising signals and another for falling signals (thus providing hysteresis). The D flip-flop 515 output is also coupled to the control input of an offset multiplexer 520 and to a PDM follower 525.

The offset multiplexer 520 outputs a 0 offset or an offset set by the microprocessor, depending on the control input from the D flip-flop 515. This offset is subtracted from the receive AGC adjust signal and the difference is input to the receive AGC linearizer. This allows the microprocessor, by writing the proper offset to the offset register, to compensate at the AGC for the gain imposed by the LNA. This causes the combined gain of the LNA and AGC amplifier to change smoothly, with no discontinuity (except for the unavoidable but brief transition spike).

The D flip-flop output is delayed by an interval approximately the same as the delay of the PDM DAC and its output filter (52 μs in the preferred embodiment), by the PDM follower 525. This delay helps reduce the transition spike by synchronizing as closely as possible the gain changes of the LNA and AGC amplifiers. An exclusive OR (XOR) gate 530 controls the polarity of the output. If it is desired to invert the polarity of the range control bit to the LNA, the microprocessor writes a logical 1 to the polarity control input. The range control bit will be allowed through the XOR gate 530 if the microprocessor writes a logical 0 to the polarity control input. This allows use of LNA circuits with either active high or active low gain boost control pins.

The output of the XOR gate 530 is also optionally read by the microprocessor. This enables the microprocessor to monitor operation of the circuit.

The receive linearizer 240 of the present invention operates in the same manner as the transmit linearizer 225 discussed above. Both the receive and transmit linearizers 240 and 225 are illustrated in FIG. 6.

The output of the receive linearizer 240 is input to a PDM DAC 245 to be converted from a digital signal to an analog signal. In the preferred embodiment, this DAC 245 is clocked with a 9.8304 MHz clock as in the transmit DAC 230. The analog receive AGC adjust signal is input to the control port of the receive AGC.

In the manner described above, the digital AGC apparatus of the present invention provides linear, digital automatic gain control of the receive and transmit AGC amplifiers. The present invention additionally provides range control of both the LNA and the UHF transmit power amplifier.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A linearized digital control apparatus for automatic gain control (AGC) in a radio having a transmit AGC amplifier and a receive AGC amplifier, the apparatus comprising:

a received signal strength detector, coupled to the receive AGC amplifier, for generating a digital power level signal from a received signal;

an integrator, coupled to the received signal strength detector, for generating a digital AGC adjust signal;

a receive linearizer having a plurality of receive slope values and a plurality of receive offset values, coupled to the integrator, for generating a linearized receive adjust signal in response to one of the plurality of receive slope values and one of the plurality of receive offset values;

a receive digital to analog converter coupled to the receive linearizer for converting the linearized receive adjust signal into an analog receive adjust signal, the analog receive adjust signal controlling the gain of the receive AGC amplifier;

a transmit linearizer having a plurality of transmit slope values and a plurality of transmit offset values, coupled to the integrator, for generating a linearized transmit adjust signal in response to one of the plurality of transmit slope values and one of the plurality of transmit offset values; and a transmit digital to analog converter coupled to the transmit linearizer for converting the linearized transmit adjust signal into an analog transmit adjust signal, the analog transmit adjust signal controlling the gain of the transmit AGC amplifier.

2. The linearized digital control apparatus of claim 1 further comprising:

a closed loop power control circuit for accepting transmit power control commands; and a summer having a first input coupled to the closed loop power control circuit, a second input coupled to the integrator, and an output coupled to the transmit linearizer, the summer for adding a received digital power control signal to the digital AGC adjust signal.

3. The linearized digital control apparatus of claim 2 further comprising a transmit power limiting control coupled to an input of the closed loop power control circuit, the transmit power limiting control restricting the digital AGC adjust signal to a maximum gain adjustment.

4. The linearized digital control apparatus of claim 1 further comprising a power amplifier coupled to an output of the transmit AGC amplifier and a low noise amplifier coupled to an input of the receive AGC amplifier.

5. The linearized digital control apparatus of claim 4 further comprising a power amplifier range control, coupled to the integrator and to a control input of the power amplifier, for generating a power amplifier gain control signal.

6. The linearized digital control apparatus of claim 5 wherein said power amplifier range control comprises:

a plurality of comparators, for generating a plurality of comparison signals in response to a transmit AGC adjust signal and a plurality of range threshold signals; and a priority encoder, coupled to said plurality of comparators, for generating said power amplifier gain control signal in response to said plurality of comparison signals.

7. The linearized digital control apparatus of claim 4 further comprising a low noise amplifier range control, coupled to the integrator and to a control input of the low noise amplifier, for generating a low noise amplifier gain control signal.

8. The linearized digital control apparatus of claim 7 wherein said low noise amplifier has a plurality of gain ranges selectable by said low noise amplifier gain control signal, and wherein said low noise amplifier range control comprises:

a comparator for generating a comparison signal in response to said digital AGC adjust signal and a plurality of range threshold signals; and a summer, coupled to said comparator, for altering said digital AGC adjust signal by a compensating offset amount when said low noise amplifier transitions between a first and second of said plurality of gain ranges.

9. The linearized digital control apparatus of claim 2 wherein the received digital power control signal is scaled by a predetermined constant.

10. The linearized digital control apparatus of claim 1 wherein the integrator is coupled to the transmit linearizer through a first order recursive low pass filter.

11. The linearized digital control apparatus of claim 1 wherein the digital power level signal provides a logarithmic response.

12. A linearized digital control apparatus for automatic gain control (AGC) in a radio having a transmit AGC amplifier and a receive AGC amplifier, the transmit AGC amplifier being coupled to a power amplifier, a low noise amplifier being coupled to the receive AGC amplifier through a bandpass filter, the apparatus comprising:

a received signal strength detector, coupled to the receive AGC amplifier, for generating a digital power level signal from a received signal, the digital power level signal being adjusted to provide a logarithmic response;

an integrator, coupled to the receive signal strength detector, for generating a digital AGC adjust signal;

a filter, coupled to the integrator, for filtering the digital AGC adjust signal;

a low noise amplifier gain control, coupled to the integrator and the low noise amplifier, for adjusting the gain of the low noise amplifier;

a receive linearizer having a plurality of receive slope values and a plurality of receive offset values, coupled to the low noise amplifier gain control, for generating a linearized receive adjust signal in response to one of the plurality of receive slope values and one of the plurality of receive offset values;

a receive digital to analog converter coupled to the receive linearizer for converting the linearized receive adjust signal into an analog receive adjust signal, the analog receive adjust signal controlling the gain of the receive AGC amplifier;

a transmit power limiting circuit, coupled to the filter, for limiting the digital AGC adjust signal to a maximum gain adjustment;

a transmit linearizer having a plurality of transmit slope values and a plurality of transmit offset values, coupled to the integrator and transmit power limiting circuit, for generating a linearized transmit adjust signal in response to one of the plurality of transmit slope values and one of the plurality of transmit offset values; and a transmit digital to analog converter coupled to the transmit linearizer for converting the linearized transmit adjust signal into an analog transmit adjust signal, the analog transmit adjust signal controlling the gain of the transmit AGC amplifier.

13. A method for linearized digital automatic gain control (AGC) in a radio having a transmit AGC amplifier, a receive AGC amplifier, a transmit linearizer having a plurality of transmit slope values and a plurality of transmit offset values, and a receive linearizer having a plurality of receive slope values and a plurality of receive offset values, the method comprising the steps of:

the radio receiving a signal;

generating a digital power level signal from the received signal;

integrating the digital power level signal to generate a digital AGC adjust signal;

generating a linearized digital receive adjust signal in response to one of the plurality of receive slope values and one of the plurality of receive offset values;

converting the linearized digital receive adjust signal into an analog receive adjust signal, the analog receive adjust signal controlling the gain of the receive AGC amplifier;

generating a linearized digital transmit adjust signal; and converting the linearized digital transmit adjust signal into an analog transmit adjust signal, the analog transmit adjust signal controlling the gain of the transmit AGC amplifier.

14. The method of claim 13 further comprising the step of limiting the linearized digital transmit adjust signal to a maximum gain adjustment.

* * * * *